United States Patent
Tsuboi et al.

(10) Patent No.: US 9,816,874 B2
(45) Date of Patent: Nov. 14, 2017

(54) POWER GENERATION DEVICE, MEASUREMENT DEVICE, AND MEASUREMENT SYSTEM FOR GENERATING POWER BY INCREASING HEAT QUANTITY DUE TO VIBRATION

(71) Applicant: FUJITSU LIMITED, Kawasaki-shi, Kanagawa (JP)

(72) Inventors: Osamu Tsuboi, Kawasaki (JP); Norinao Kouma, Atsugi (JP)

(73) Assignee: FUJITSU LIMITED, Kawasaki (JP)

(*) Notice: Subject to any disclaimer, the term of this patent is extended or adjusted under 35 U.S.C. 154(b) by 385 days.

(21) Appl. No.: 14/613,834

(22) Filed: Feb. 4, 2015

(65) Prior Publication Data
US 2015/0153237 A1 Jun. 4, 2015

Related U.S. Application Data

(63) Continuation of application No. PCT/JP2012/073935, filed on Sep. 19, 2012.

(51) Int. Cl.
*G01K 7/02* (2006.01)
*H01L 35/32* (2006.01)
*H02N 2/18* (2006.01)
*H02N 11/00* (2006.01)
*G08C 17/02* (2006.01)

(52) U.S. Cl.
CPC ............. *G01K 7/02* (2013.01); *H01L 35/32* (2013.01); *H02N 2/186* (2013.01); *G08C 17/02* (2013.01); *H02N 11/002* (2013.01)

(58) Field of Classification Search
CPC ........... G01K 7/02; H01L 35/32; H01L 35/34; H02N 2/186; H02N 2/188; H02N 11/002; G08C 17/02
See application file for complete search history.

(56) References Cited

U.S. PATENT DOCUMENTS 6,700,052 B2 * 3/2004 Bell .................. H01L 35/32
 136/201
6,984,902 B1 * 1/2006 Huang .................. H02N 2/186
 310/26

(Continued)

FOREIGN PATENT DOCUMENTS

JP H10-1645 1/1998
JP H10-239191 9/1998

(Continued)

OTHER PUBLICATIONS

Computer translation of JP 2004-254923 (Koga et al) from the JPO website. Apr. 19, 2017.*

(Continued)

*Primary Examiner* — Randy Gibson
(74) *Attorney, Agent, or Firm* — Kratz, Quintos & Hanson, LLP

(57) ABSTRACT

A power generation device includes a thermoelectric conversion part; a cooling member configured to be disposed on one principal surface of the thermoelectric conversion part; and a heat generation part configured to be disposed on another principal surface of the thermoelectric conversion part, to be formed of a viscoelastic body having a plurality of cavities formed in the viscoelastic body, and to generate heat by violation.

8 Claims, 14 Drawing Sheets

(56) References Cited

U.S. PATENT DOCUMENTS

| | | | | |
|---|---|---|---|---|
| 8,110,736 | B2* | 2/2012 | Iwanade | H01L 35/32 |
| | | | | 136/201 |
| 8,410,955 | B2* | 4/2013 | Schmidt | G08C 17/02 |
| | | | | 340/870.39 |
| 8,685,758 | B2* | 4/2014 | Suzuki | H01L 35/08 |
| | | | | 136/200 |
| 9,263,659 | B2* | 2/2016 | Ward | H01L 35/02 |
| 9,312,466 | B2* | 4/2016 | Ward | H01L 35/32 |
| 2005/0115600 | A1 | 6/2005 | DeSteese | |
| 2005/0115601 | A1 | 6/2005 | Olsen | |
| 2005/0139250 | A1 | 6/2005 | DeSteese | |
| 2007/0125413 | A1 | 6/2007 | Olsen | |
| 2007/0290422 | A1* | 12/2007 | Akashi | F16F 1/3737 |
| | | | | 267/136 |
| 2008/0173537 | A1 | 7/2008 | DeSteese | |
| 2011/0121990 | A1 | 5/2011 | Schmidt | |
| 2013/0283638 | A1* | 10/2013 | Diepenbrock | A43B 17/003 |
| | | | | 36/44 |
| 2014/0174496 | A1* | 6/2014 | Park | H01L 35/325 |
| | | | | 136/224 |

FOREIGN PATENT DOCUMENTS

| | | | | |
|---|---|---|---|---|
| JP | 2004-63656 A1 | 2/2004 | | |
| JP | 2004-254923 A1 | 9/2004 | | |
| JP | 2007-518252 A | 7/2007 | | |
| JP | 2009-284633 A1 | 12/2009 | | |
| JP | 2010-536212 A | 11/2010 | | |
| WO | WO 2006/001827 A2 * | 1/2006 | | H01L 35/32 |
| WO | WO 2009/021807 A1 * | 2/2009 | | G08C 17/02 |

OTHER PUBLICATIONS

Office Action dated Sep. 1, 2015 issued with respect to the corresponding Japanese Patent Application No. 2014-536444: partial translation of office action.

International Search Report for International Application No. PCT/JP2012/073935 dated Dec. 25, 2012.

Translation of the Written Opinion of the International Searching Authority (2 Sheets translation, 6 Sheets total).

* cited by examiner

POWER GENERATION DEVICE, MEASUREMENT DEVICE, AND MEASUREMENT SYSTEM FOR GENERATING POWER BY INCREASING HEAT QUANTITY DUE TO VIBRATION

CROSS-REFERENCE TO RELATED APPLICATIONS

This application is a continuation application of International Application PCT/JP2012/073935 filed on Sep. 19, 2012 and designated for the U.S., the entire contents of which are incorporated herein by reference.

FIELD

The disclosures herein generally relate to a power generation device, a measurement device, and a measurement system.

BACKGROUND

Recently, a measurement device has drawn attention that can operate without using a primary battery, to save time and trouble of battery replacement.

As one of such measurement devices, a measurement device has been proposed that uses, for example, a solar battery as the power source.

Conventional technologies include those in the following list.

RELATED-ART DOCUMENTS

Patent Documents

[Patent Document 1] Japanese Laid-open Patent Publication NO. 10-239191
[Patent Document 2] Japanese Laid-open Patent Publication NO. 2004-63656

However, it is difficult to obtain sufficient electric power by using a solar battery, for example, in a place where the amount of light is scarce.

SUMMARY

According to an embodiment of the present invention, a power generation device includes a thermoelectric conversion part; a cooling member configured to be disposed on one principal surface of the thermoelectric conversion part; and a heat generation part configured to be disposed on another principal surface of the thermoelectric conversion part, to be formed of a viscoelastic body having a plurality of cavities formed in the viscoelastic body, and to generate heat by vibration.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

To obtain electric power, one may attach a power generation device to an oscillating body, for converting vibrational energy transferred from the oscillating body into electric energy.

However, it is not necessarily easy to efficiently convert such vibrational energy transferred from an oscillating body into electric energy.

For instance, a great Quality factor may be applied. In general, the Q factor indicates an index representing a quality of a resonance. The Quality factor is obtained by dividing energy stored in a system during one oscillation period by energy dissipating from the system. The greater the Q factor, the more stable vibration is. Hence, vibrational energy may be efficiently converted into electric energy by setting a great Quality factor. However, if the vibration frequency is shifted, the set great Quality factor may extremely reduce the energy conversion efficiency.

First Embodiment

Figure 1:
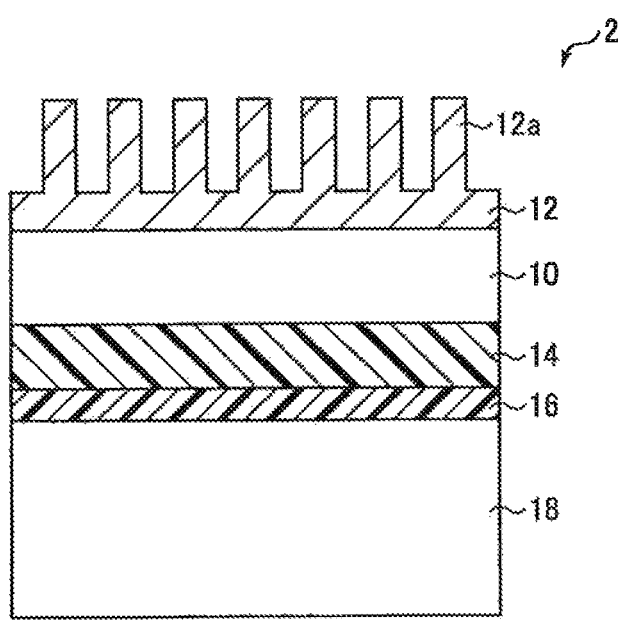
FIG. 1 is a cross-sectional view illustrating a power generation device according to a first embodiment of the present invention.
Figure 2:
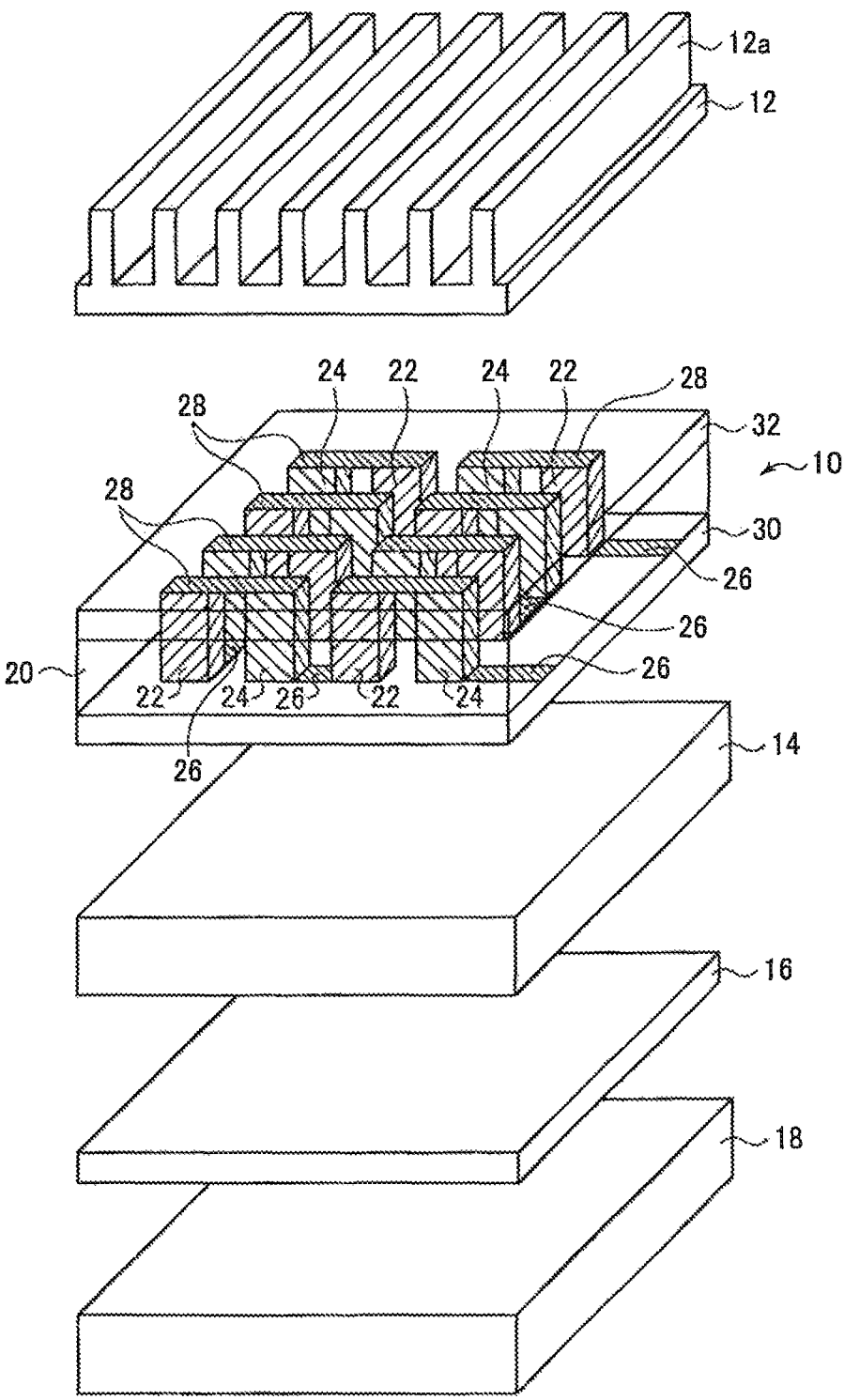
FIG. 2 is a perspective view illustrating elements of a power generation device according to the first embodiment.

A power generation device will be described according to a first embodiment, using FIGS. 1 to 4. FIG. 1 is a cross-sectional view illustrating a power generation device 2 according to the present embodiment. FIG. 2 is a perspective view illustrating elements of the power generation device 2 according to the present embodiment.

As illustrated in FIGS. 1-2, according to the present embodiment, the power generation device 2 includes a thermoelectric conversion part 10, a cooling member 12, a heat generation part 14, and a highly-thermal-resistant member 16, and is attached to an oscillating body 18 to be used.

Figure 3:
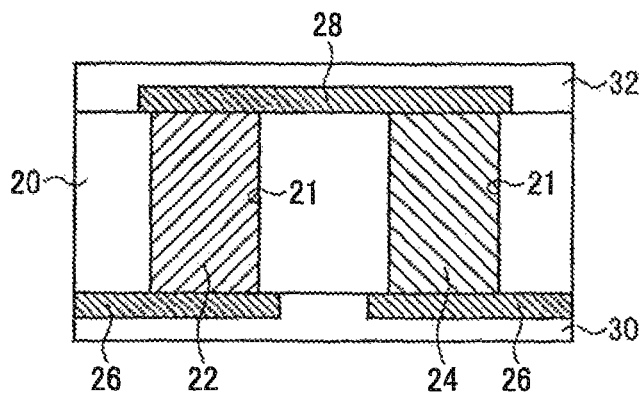
FIG. 3 is an enlarged cross-sectional view illustrating a part of a thermoelectric conversion part.

The thermoelectric conversion part (a thermoelectric conversion member, or a thermoelectric conversion element) 10 is configured, for example, as illustrated in FIG. 2. FIG. 3 is an enlarged cross-sectional view illustrating a part of the thermoelectric conversion part 10.

Multiple openings 21 are formed in a protection part 20. A material having comparatively low heat conductivity is used for the protection part 20. Here, as a material of the protection part 20, for example, a photosensitive glass substrate is used. Note that a material of the protection part 20 is not limited to the glass, but a material having comparatively low heat conductivity may be appropriately used.

In each of the openings 21, an N-type semiconductor material structure 22 and a P-type semiconductor material structure 24 are embedded. As a material of the N-type semiconductor material structure 22 and the P-type semiconductor material structure 24, for example, an alloy semiconductor is used that includes bismuth (Bi) and tellurium (Te). Note that a material of the N-type semiconductor material structure 22 and the P-type semiconductor material structure 24 is not limited to that. For example, it is possible to use a compound semiconductor such as InSb (indium antimony), GaAs (gallium arsenide), or the like. Also, a semiconductor having a perovskites-type crystal structure may be used, such as STO (strontium titanate) or the like. Also, a metal oxide semiconductor may be used, such as ZnO (zinc oxide).

On both surfaces of the protection part 20, connection electrodes 26 and 28 are formed so that the N-type semiconductor material structures 22 and the P-type semiconductor material structures 24 are electrically connected with each other in series and alternately.

On principal surfaces on both sides of the protection part 20 where the connection electrodes 26 and 28 are formed, protective films 30 and 32 are formed, respectively. As a material of the protective films 30 and 32, a material having comparatively high heat conductivity is used. Here, as a material of the protective films 30 and 32, for example, an aluminum oxide film is used.

The dimension of the thermoelectric conversion part 10 is, for example, about 10 mm by 10 mm by 0.5 mm.

When a temperature difference is generated between one principal surface and the other principal surface of the thermoelectric conversion part 10, a non-equilibrium state of carriers is generated in the semiconductor material structures 22 and 24, and a potential difference is generated. The potential difference is about 100 μV per temperature difference of 1° C. Note that the polarities of generated electromotive force are different between the N-type semiconductor material structures 22 and the P-type semiconductor material structure 24. Therefore, by connecting them in series as in FIG. 2, a great electromotive force can be obtained that is proportional to the number of connections. Using electric power output from the thermoelectric conversion part 10, it is possible to drive a sensor 52 (see FIG. 17), a calculation element (for example, an MPU (Micro Processor Unit)) 46 (see FIG. 17), a transmission circuit 48 (see FIG. 17), a transceiver circuit 54 (see FIG. 17), and the like.

On one surface of the thermoelectric conversion part 10 (on the upper side in the sheet of FIG. 1), a cooling member (a heat sink or a heat radiation plate) 12 is provided for cooling. The cooling member 12 is provided for effectively cooling the one surface of the thermoelectric conversion part (heating element) 10 (on the upper side in the sheet of FIG. 1). The one surface of the thermoelectric conversion part 10 (the surface on the upper side in the sheet of FIG. 1) contacts one surface of the cooling member 12 (the surface on the lower side in the sheet of FIG. 1). The cooling member 12 is fixed on the thermoelectric conversion part 10, for example, by using an adhesive (not illustrated). An adhesive having comparatively high heat conductivity is used here. An adhesive having comparatively high heat conductivity is used for effectively cooling the one surface of the thermoelectric conversion part 10 (the upper side in the sheet of FIG. 1). As a material of the cooling member 12, for example, aluminum (Al), copper (Cu), or the like may be used. The cooling member 12 is formed to have a greater surface area for effective cooling. Here, multiple fins 12a are formed to make the surface area greater. The external dimensions of the thermoelectric conversion part 10 are, for example, about 10 mm by 10 mm by 0.5 mm.

On the other surface of the thermoelectric conversion part 10 (the lower side in the sheet of FIG. 1), a heat generation part (a vibration-driven heat generation part or a vibration-driven heat generation member) 14 is provided that deforms by vibration, and generates heat by converting kinetic energy into thermal energy. The other surface of the thermoelectric conversion part 10 (the surface on the lower side in the sheet of FIG. 1) contacts one surface of the heat generation part 14 (the surface on the upper side in the sheet of FIG. 1). The thermoelectric conversion part 10 is bonded with the heat generation part 14, for example, by using an adhesive (not illustrated). An adhesive having comparatively high heat conductivity is used here. An adhesive having comparatively high heat conductivity is used for effectively transmitting the heat generated by the heat generation part 14 to the other surface of the thermoelectric conversion part 10 (the surface on the lower side in the sheet of FIG. 1).

The dimensions of the heat generation part 14 is, for example, about 10 mm by 10 mm by 0.5 mm.

As a material of the heat generation part 14, a viscoelastic body (viscoelastic material) is used. Viscoelasticity is a property that has both viscosity and elasticity. Viscosity is a property of an object, which deforms when applied with a force, and remains deformed after releasing the force. Elasticity is a property of an object, which deforms when applied with a force, and recovers the original shape after releasing the force. A viscoelastic body is an object that exhibits viscoelasticity. A viscoelastic body exhibits viscosity deformation accompanying elastic deformation. Viscoelastic bodies include, for example, high-molecule materials such as rubber or plastic.

The inventors of the present invention have performed experiments using a viscoelastic body as follows.

Namely, first, generated heat is measured when the viscoelastic body is deformed. The viscoelastic body used here does not have multiple cavities 34 (see FIG. 4) formed, which will be described later. As the viscoelastic body, a small piece of a gelatinous material called "βGEL" (trademark) is used, which is a product of Taica Corporation. The dimensions of the viscoelastic body is 20 mm by 18 mm by 10 mm. Note that measurement is performed using a heat insulating material for head insulation, not to have the heat generated in the viscoelastic body transferred to the outside.

Deforming is performed for a hundred times in which the viscoelastic body is deformed by 50% with a load of 7 N, and the temperature of a center part of the viscoelastic body rises from 23.7° C. to 31.5° C.

Next, generated heat is measured when vibration is applied to the viscoelastic body. The viscoelastic body used here does not have cavities formed, which is the same as above. As the viscoelastic body, a small piece of the gelatinous material βGEL (trademark) of Taica Corporation is used, which is the same as above. The dimensions of the viscoelastic body is 20 mm by 18 mm by 10 mm, which is the same as above. Note that measurement is performed using a heat insulating material for head insulation, not to have the heat generated in the viscoelastic body externally transferred.

Vibration at 40 Hz by 5 G is applied to the viscoelastic body, and the temperature of a center part of the viscoelastic body rises from 25.5° C. to 33.6° C.

From these experiments, it can be understood that practical heat generation can be performed by having the viscoelastic body deformed by several dozen percent.

However, the heat generation part 14 in the power generation device 2 has a sheet shape as a whole according to the present embodiment. Therefore, it is difficult to generate deforming of several dozen percent for the sheet-shaped viscoelastic body by vibration transferred from the oscillating body 18.

Then, the inventors of the present invention came up with an idea for obtaining great deformation locally in locations of the viscoelastic body 15, by forming cavities 34 in the viscoelastic body 15.

Then, the inventors of the present invention have performed simulations by using a finite element method as follows.

Namely, simulations are performed for the amount of deformation when a load is applied to a sheet-shaped viscoelastic body not having cavities formed, and for the amount of deformation when a load is applied to a sheet-shaped viscoelastic body having cavities formed, respectively.

The diameter of a cavity is 10 μm, each cavity has a cylindrical shape, and the number of cavities is 20 per 110 μm. The longitudinal direction of the cylinder-shaped cavities is parallel to the principal surface of the viscoelastic body.

In both cases, Poisson's ratio of the viscoelastic body is 0.48, the thickness of the viscoelastic body is 70 μm, Young's modulus of the viscoelastic body is 150 Pa, and the density of the viscoelastic body is 0.56 g/cm$^3$.

A load applied to the upper surface of the film-shaped viscoelastic body is 200 MPa in both cases.

The amount of deformation is 0.9 μm for the sheet-shaped viscoelastic body not having cavities formed.

On the other hand, the amount of deformation is 110 μm locally for the sheet-shaped viscoelastic body having the cavities formed. Namely, the amount of deformation increases about 12 times greater locally for the sheet-shaped viscoelastic body having the cavities formed cavity, compared to the sheet-shaped viscoelastic body net having the cavities formed.

From these simulations, it can be understood that when forming multiple cavities in the viscoelastic body, a stress locally concentrates on locations between the cavities to generate great deformation, with which a great heat quantity is obtained.

Figure 4:
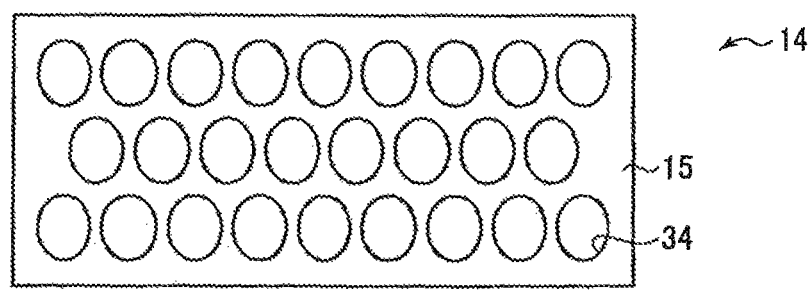
FIG. 4 is an enlarged cross-sectional view illustrating a part of a heat generation part that is used in a power generation device according to the first embodiment.

FIG. 4 is an enlarged cross-sectional view illustrating a part of the heat generation part 14 that is used in the power generation device 2 according to the present embodiment.

As illustrated in FIG. 4, the viscoelastic body 15 used for the heat generation part 14 has multiple cavities (bubbles) 34 formed in it. The shape of a cavity 34 is, for example, spherical or ellipsoidal. The diameter of a cavity 34 is, for example, about 50 μm. The density of cavities 34 is, for example, about 50%.

Note that FIG. 4 conceptually illustrates an arrangement of the cavities 34; the cavities 34 are not necessarily arranged regularly.

Also, the shape of a cavity 34 is not limited to be spherical or ellipsoidal.

By forming multiple cavities in the viscoelastic body in this way, a stress locally concentrates on locations between the cavities when vibration is applied, to generate great deformation locally, with which a great heat quantity is obtained.

As the viscoelastic body 15 used for the heat generation part 14, for example, a silicone resin may be used. For example, the gelatinous material βGEL (trademark) of Taica Corporation may be used as the silicone resin.

The viscoelastic body 15 having the cavities 34 can be formed, for example, as follows.

Namely, first, a gelatinous silicone resin (not illustrated) is poured into a mixer container (not illustrated) of a mixer (not illustrated).

Next, the gelatinous silicone resin is crushed to pieces by the mixer, to make it into a half-paste.

Next, a powdered foaming agent (not illustrated) is poured into the mixer container holding the half-pasted silicone resin, to be stirred by the mixer. As a foaming agent, for example, sodium bicarbonate is used. In this way, the foaming agent is uniformly mixed into the silicone resin.

Next, bubbles are removed from the silicone resin having the foaming agent mixed (defoaming). Note that the foaming agent is not foamed at this stage.

Next, the silicone resin having defoaming applied is formed into a predetermined shape.

Next, a heat treatment is applied to the silicone resin having formed into the predetermined shape (baking). The heat treatment temperature is, for example, about 150° C. The heat treatment time is, for example, about one hour. This makes the foaming agent foam, which has been mixed in the silicone resin, and a viscoelastic body 15 of the silicone resin is obtained that has bubbles (cavities) 34 formed.

On the other surface of the heat generation part 14 (the surface on the lower side in the sheet of FIG. 1), a highly-thermal-resistant member (a thermal resistance layer, a highly-thermal-resistant layer, and a heat-insulating layer) 16 having a comparatively high thermal resistance is disposed. The other surface of the heat generation part 14 (the surface on the lower side in the sheet of FIG. 1) contacts one surface of the highly-thermal-resistant member 16 (the surface on the upper side in the sheet of FIG. 1). The highly-thermal-resistant member 16 prevents heat generated by the heat generation part 14 from transferring toward the oscillating body 18, and makes the temperature difference great between the one principal surface and the other principal surface in the thermoelectric conversion part 10, to efficiently generate power. To effectively prevent the heat generated by the heat generation part 14 from transferring toward the oscillating body 18, it is preferable that the thermal resistance $R_{\theta HTR}$ of the highly-thermal-resistant member 16 is greater than the sum of the thermal resistance $R_{\theta HS}$ of the cooling member 12 and the thermal resistance $R_{\theta TEG}$ of the thermoelectric conversion part 10. Namely, it is preferable to satisfy Formula (1) below.

$$R_{\theta HTR} > R_{\theta HS} + R_{\theta TEG} \quad (1)$$

By having the highly-thermal-resistant member 16 disposed between the heat generation part 14 and the oscillating body 18, the heat generated by the heat generation part 14 can be preferentially transferred toward the thermoelectric conversion part 10.

As a material of the highly-thermal-resistant member 16, a highly-thermal-resistant material that satisfies the above condition may be appropriately used. For example, rubber, an epoxy adhesive, or the like may be used for the material of the highly-thermal-resistant member 16.

Also, a material that includes bubbles, such as urethane foam, may be used as the material of the highly-thermal-resistant member 16. If using a material including bubbles as the material of the highly-thermal-resistant member 16, a sufficiently high thermal resistance can be obtained.

The heat generation part 14 is preferably softer and easier to be deformed than the highly-thermal-resistant member 16. This is because, by greatly deforming the heat generation part 14 when vibration is transferred from the oscillating body 18 to the power generation device 2, a great heat quantity can be obtained in the heat generation part 14.

Therefore, it is preferable that the equivalent spring constant $k_{HTR}$ of the highly-thermal-resistant member 16 is greater than the equivalent spring constant $k_{VE}$ of the heat generation part 14. Namely, it is preferable to satisfy Formula (2) below.

$$k_{HTR} < k_{VE} \quad (2)$$

The dimensions of the highly-thermal-resistant member 16 are, for example, 10 mm by 10 mm by 0.5 mm.

The other surface of the highly-thermal-resistant member 16 (the surface on the lower side in the sheet of FIG. 1) is fixed on the oscillating body (oscillating object) 18. The other surface of the highly-thermal-resistant member 16 (the surface on the lower side in the sheet of FIG. 1) contacts one surface of the oscillating body 18 (the surface on the upper side in the sheet of FIG. 1).

According to the present embodiment, the power generation device 2 is attached to the oscillating body 18 so that the heat generation part 14 is positioned between the thermoelectric conversion part 10 and the oscillating body 18, and the highly-thermal-resistant member 16 is positioned between the heat generation part 14 and the oscillating body 18.

The oscillating body 18 may be, for example, a motor installed in a factory, an automobile, or the like.

According to the present embodiment, the power generation device 2 has the heat generation part 14 generate heat by vibration transferred from the oscillating body 18, and has a temperature difference generated between the one principal surface and the other principal surface of the thermoelectric conversion part 10, to generate power.

In the power generation device 2 according to the present embodiment, the thermoelectric conversion part 10 and the cooling member 12 are relatively harder, not easier to be deformed, and heavier, to function as a rigid body.

On the other hand, in the power generation device 2 according to the present embodiment, the heat generation part 14 is softer, easier to be deformed, and lighter, to function as a deforming part.

Note that the vibration-driven power generation member 14 and the highly-thermal-resistant member 16 may together function as a deforming part.

Since the heat generation part 14 functioning as a deforming part is positioned between the thermoelectric conversion part 10, the cooling member 12, and the oscillating body 18 functioning as a rigid body, a temporal shift is generated between the vibration of the thermoelectric conversion part 10 and the cooling member 12, and the vibration of the heat generation part 14. Namely, a phase difference is generated between the vibration of the thermoelectric conversion part 10 and the cooling member 12, and the vibration of the heat generation part 14. This phase difference is absorbed by the deforming part, namely, the deformation of the heat generation part 14 and the like.

The heat generation part 14 is formed of the viscoelastic body 15 as described above. Therefore, the deforming part, namely, the heat generation part 14 and the like can be considered as a spring. According to the present embodiment, when the power generation device 2 vibrates, kinetic energy is conserved by the repulsive force of the spring of the deforming part, namely, the heat generation part 14 or the like. On the other hand, the kinetic energy is converted into thermal energy by the viscosity of the viscoelastic body 15 used in the heat generation part 14. Therefore, heat can be generated in the heat generation part 14.

Further, in the power generation device 2 according to the present embodiment, since the heat generation part 14 as the spring is formed of the sheet-shaped viscoelastic body 15, the Q value is comparatively small. Therefore, according to the present embodiment, the power generation device 2 is obtained that is highly versatile without extremely depending on the frequency of the oscillating body 18.

In this way, according to the present embodiment, the heat generation part 14 is formed using the viscoelastic body 15 having the multiple cavities 34 formed. In the viscoelastic body 15 having the multiple cavities 34 formed, when vibration is applied, a great stress locally concentrates on locations between the cavities 34 to generate great deformation, with which a great heat quantity is obtained. Therefore, according to the present embodiment, it is possible to make the temperature difference great between the one principal surface and the other principal surface in the thermoelectric conversion part 10, and to provide the power generation device 2 that can efficiently generate power.

First Modified Example

Figure 5:
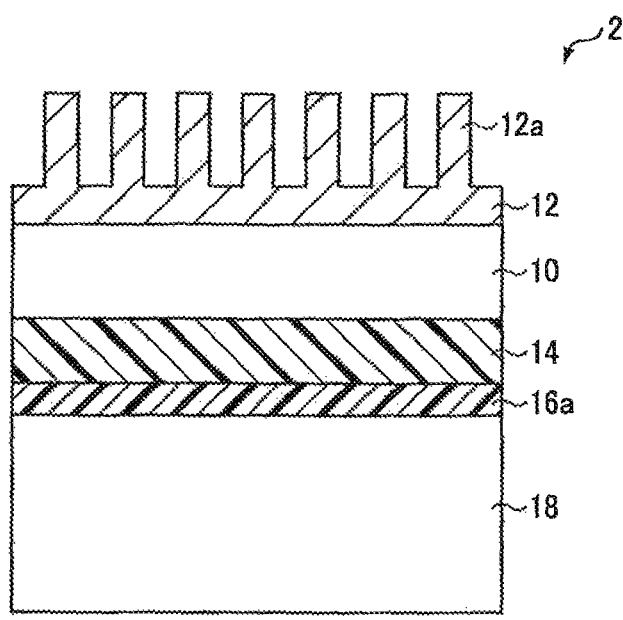
FIG. 5 is a cross-sectional view illustrating a power generation device according to a first modified example of the first embodiment.

Next, a power generation device will be described according to a first modified example of the present embodiment, using FIGS. 5-6C. FIG. 5 is a cross-sectional view illustrating a power generation device 2 according to the present modified example.

According to the present embodiment, the power generation device 2 has a heat generation part 14 and a highly-thermal-resistant member 16a continuously formed, namely, the heat generation part 14 and the highly-thermal-resistant member 16a formed as a whole.

The heat generation part 14 is formed of a viscoelastic body 15 having cavities 34 formed. As a material of the viscoelastic body 15, for example, a gelatinous silicone resin is used.

On the other hand, the highly-thermal-resistant member 16a is formed of a highly-thermal-resistant material layer 17 that has a comparatively high thermal resistance. As the highly-thermal-resistant material layer 17, for example, a gelatinous silicone resin is used that has cavities 35 formed. The diameter of a cavity 35 is, for example, about 5 μm. The ratio of cavities 35 per unit volume is, for example, about 10%.

Since the heat treatment is applied in a state where the gelatinous silicone resin 15 used for the heat generation part 14, and the gelatinous silicone resin 15 used for the highly-thermal-resistant member 16a are stacked, the heat generation part 14 and the highly-thermal-resistant member 16a are mixed at the interface. Therefore, the heat generation part 14 and the highly-thermal-resistant member 16a are continuous. Namely, the heat generation part 14 and the highly-thermal-resistant member 16a are formed as a whole.

The size of a cavity 34 formed in the viscoelastic body 15 used for the heat generation part 14 is greater than the size of a cavity 35 formed in the highly-thermal-resistant member 16a. The reason why the size of a cavity 34 formed in the viscoelastic body 15 used for the heat generation part 14 is greater is to make the heat generation part 14 easier to be deformed, and to obtain a great heat quantity in the heat generation part 14.

On the other hand, the reason why the cavities 35 are formed in the highly-thermal-resistant member 16a is to set the thermal resistance of the highly-thermal-resistant member 16a great. By adjusting the size and density of the cavities 35 in the silicone resin 17 used for the highly-thermal-resistant member 16a, it is possible to adjust the thermal resistance of the highly-thermal-resistant member 16a. Also, by changing the composition of the silicone resin 15 and the silicone resin 17, it is also possible to adjust the thermal resistance of the highly-thermal-resistant member 16a. Thus, the size of a cavity, the density of cavities, and the material of the highly-thermal-resistant member 16a, and the respective materials of the highly-thermal-resistant member 16a and the heat generation part 14 are appropriately set to make the heat generation part 14 easier to be deformed than the highly-thermal-resistant member 16a, and to satisfy Formulas (1) and (2) above.

In this way, the heat generation part 14 and the highly-thermal-resistant member 16a may be formed continuously.

Figure 6A:
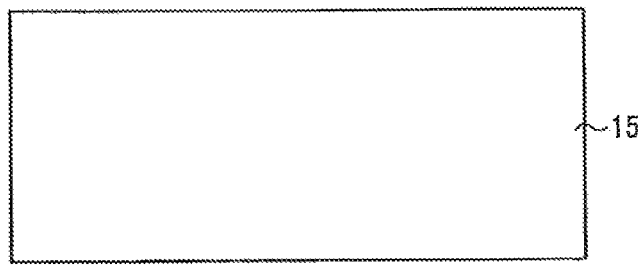
FIGS. 6A-6C are cross-sectional process views illustrating a method of continuously forming a heat generation part and a highly-thermal-resistant member.
Figure 6B:
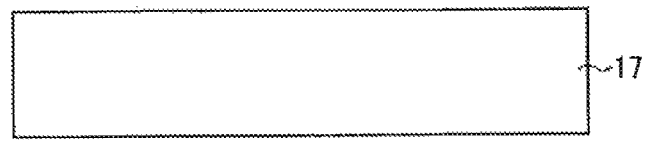
Figure 6C:
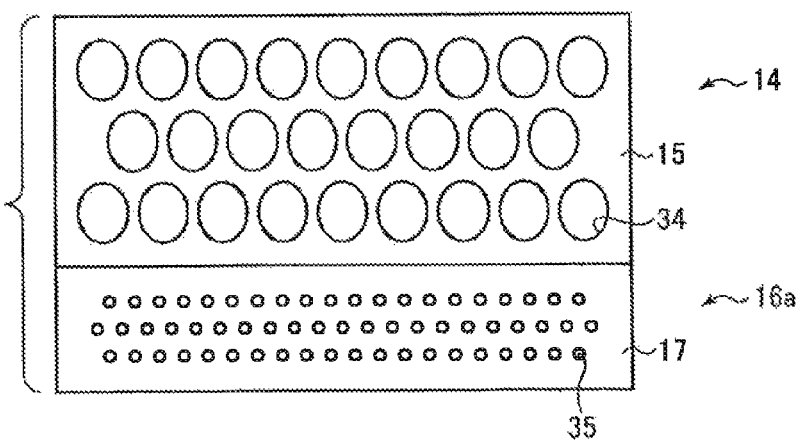

FIGS. 6A-6C are cross-sectional process views illustrating a method of continuously forming the heat generation part 14 and the highly-thermal-resistant member 16a.

For example, first, a gelatinous silicone resin (not illustrated) is poured into a mixer container (not illustrated) of a mixer (not illustrated).

Next, the gelatinous silicone resin is crushed to pieces by the mixer, to make it into a half-paste.

Next, a powdered foaming agent is poured into the mixer container holding the half-pasted silicone resin, to be stirred by the mixer. As a foaming agent, for example, sodium bicarbonate is used. Here, as a foaming agent, a foaming agent having a comparatively great average grain diameter D1 is used. The average grain diameter D1 of the foaming agent is, for example, about 5 μm. In this way, the foaming agent having the average grain diameter D1 is uniformly mixed into the silicone resin.

Next, bubbles are removed from the silicone resin having the foaming agent mixed (defoaming). Note that the foaming agent is not foamed at this stage.

Next, the silicone resin having defoaming applied is formed into a predetermined shape. In this way, a gelatinous silicone resin is obtained that has the foaming agent mixed, and is formed in the predetermined shape (see FIG. 6A).

Note that illustration of the foaming agent is omitted in FIG. 6A.

Next, a gelatinous silicone resin (not illustrated) is poured into a mixer container (not illustrated) of a mixer (not illustrated). The silicone resin poured into the mixer container this time is not the silicone resin that has already the foaming agent mixed, but is a silicone resin separately provided.

Next, the gelatinous silicone resin is crushed to pieces by the mixer, to make it into a half-paste.

Next, a powdered foaming agent is poured into the mixer container holding the half-pasted silicone resin, to be stirred by the mixer. As a foaming agent, for example, sodium bicarbonate is used. Here, as a foaming agent, a foaming agent having a comparatively small average grain diameter D2 is used. The average grain diameter D2 is smaller than the average grain diameter D1. The average grain diameter D2 of the foaming agent is, for example, about 500 nm. In this way, the foaming agent having the average grain diameter D2 is uniformly mixed into the silicone resin.

Next, bubbles are removed from the silicone resin having the foaming agent mixed (defoaming). Note that the foaming agent is not foamed at this stage.

Next, the silicone resin having defoaming applied is formed into a predetermined shape. In this way, a gelatinous silicone resin is obtained that has the foaming agent mixed, and is formed in the predetermined shape (see FIG. 6B).

Note that illustration of the foaming agent is omitted in FIG. 6B.

Next, the silicone resin 15 having the foaming agent of the average grain diameter D1 mixed, and the silicone resin 17 having the foaming agent of the average grain diameter D2 mixed, are stacked. In this way, a stacked object 19 is obtained, which is formed of the silicone resin 15 having the foaming agent of the average grain diameter D1 mixed, and the silicone resin 17 having the foaming agent of the average grain diameter D2 mixed.

Next, a heat treatment is applied to the stacked object 19 (baking). The heat treatment temperature is, for example, about 150° C. The heat treatment time is, for example, about one hour. This makes the foaming agent foam, which has been mixed in the silicone resin 15, and a viscoelastic body 15 of the silicone resin is obtained that has bubbles (cavities) 34 formed uniformly. Also, this makes the foaming agent foam, which has been mixed in the silicone resin 17, and the silicone resin 17 is obtained that has bubbles (cavities) 35 formed uniformly. In the silicone resin layer 15 having the foaming agent of the average grain diameter D1 mixed, cavities 34 are formed that have a comparatively great average grain diameter. In the silicone resin layer 17 having the foaming agent of the average grain diameter D2 mixed, cavities 35 are formed that have a comparatively small average grain diameter. At the interface between the silicone resin layer 15 and the silicone resin layer 17, the silicone resins are mixed with each other, and hence, the silicone resin layer 15 and the silicone resin layer 17 are continuous, namely, are formed as a whole. The silicone resin 15 that has the cavities 34 formed having the comparatively great average cavity diameter is used as the heat generation part 14. On the other hand, the silicone resin 17 that has the cavities formed having the comparatively small average cavity diameter is used as the highly-thermal-resistant member 16a.

Note that an example is described here where a heat treatment is applied to a stacked object 19 of two silicone resin layers 15 and 17, but it is not limited to that. For example, heat treatments may be separately applied to the silicone resin layer 15 and the silicone resin layer 17, and then, these silicone resin layers 15 and 17 may be bonded with each other.

Second Modified Example

Figure 7:
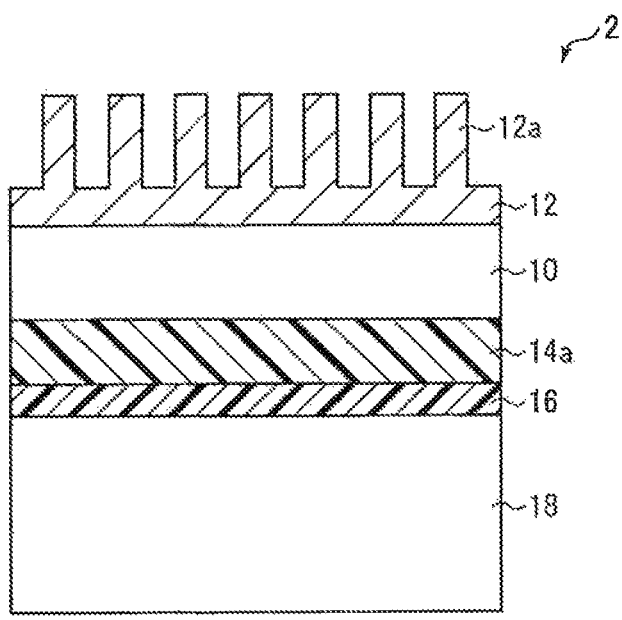
FIG. 7 is a cross-sectional view illustrating a power generation device according to a second modified example of the first embodiment.
Figure 8A:
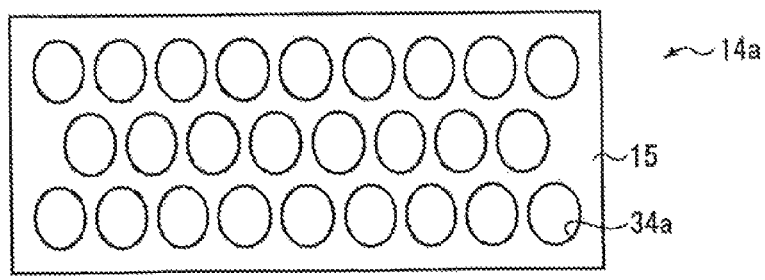
FIGS. 8A-8B are a cross-sectional view and a plan view, respectively, illustrating a part of a heat generation part that is used in a power generation device according to the second modified example of the first embodiment.
Figure 8B:
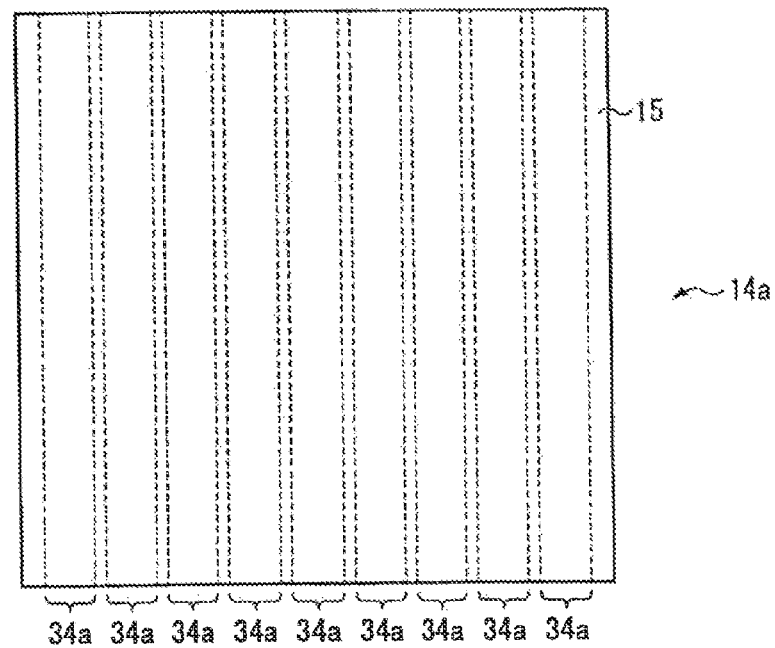

Next, a power generation device 2 will be described according to a second modified example of the present embodiment, using FIGS. 7-11. FIG. 7 is a cross-sectional view illustrating the power generation device 2 according to the present modified example. FIGS. 8A-8B are a cross-sectional view and a plan view, respectively, illustrating a part of a heat generation part 14a that is used in the power generation device 2 according to the present modified example.

According to the modified example, the power generation device 2 has the heat generation part 14a formed of a viscoelastic body 15 that has column-shaped cavities 34a formed.

As illustrated in FIGS. 7-8B, the viscoelastic body 15 used as the heat generation part 14a has multiple cavities 34a formed.

As illustrated in FIGS. 8A-8B, the cavities 34a are column-shaped. The longitudinal direction of the column-shaped cavities 34a is the in-plane direction of the principal surface of the heat generation part 14a, namely, the in-plane direction of the principal surface of the thermoelectric conversion part 10. The shape of the cross section of a column-shaped cavity 34a in the normal line direction of the principal surface of the heat generation part 14a is, for example, a circular or oval shape.

Note that the shape of the cross section of a column-shaped cavity 34a is not limited to a circular or oval shape, but may be a quadrilateral or a triangle.

FIGS. 9A-11 are process views illustrating a method of forming column-shaped cavities in the heat generation part 14a.

Figure 9A:
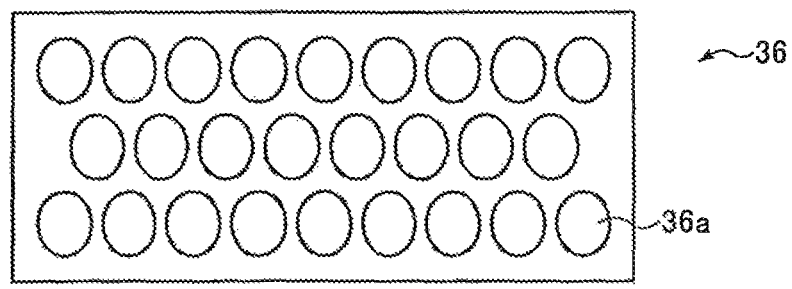
FIGS. 9A-9B are first process views illustrating a method of forming column-shaped cavities in a heat generation part.
Figure 9B:
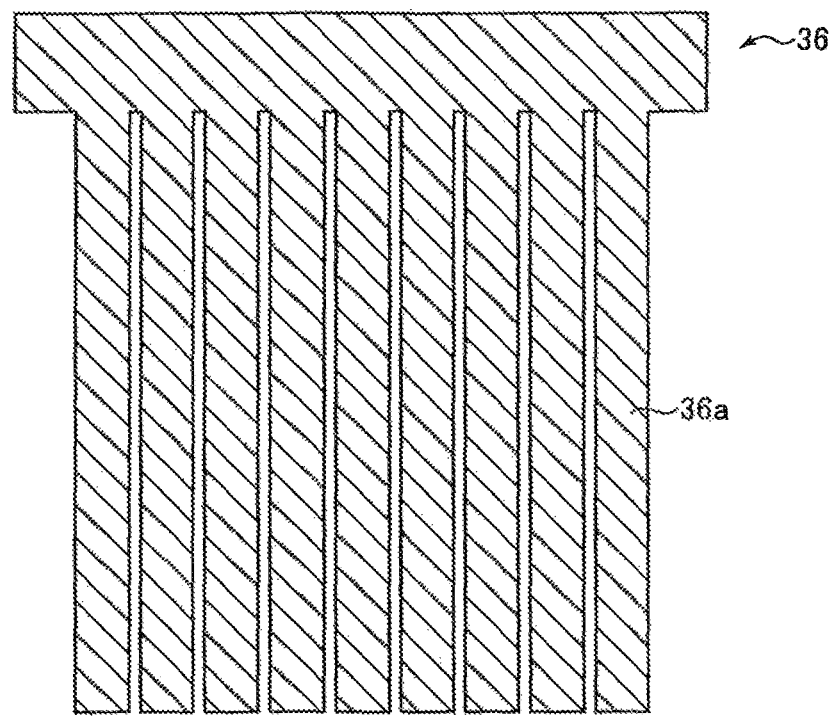

FIG. 9A is a side view illustrating a part of a mold for forming the heat generation part 14a, and FIG. 9B is a plan view illustrating a part of the mold for forming the heat generation part 14a.

As illustrated in FIGS. 9A-9B, a part of a member 36 of the mold for forming the heat generation part 14a has multiple column-shaped objects 36a formed. The column-shaped objects 36a are provided for forming the column-shaped cavities 34a in the heat generation part 14a.

Figure 10:
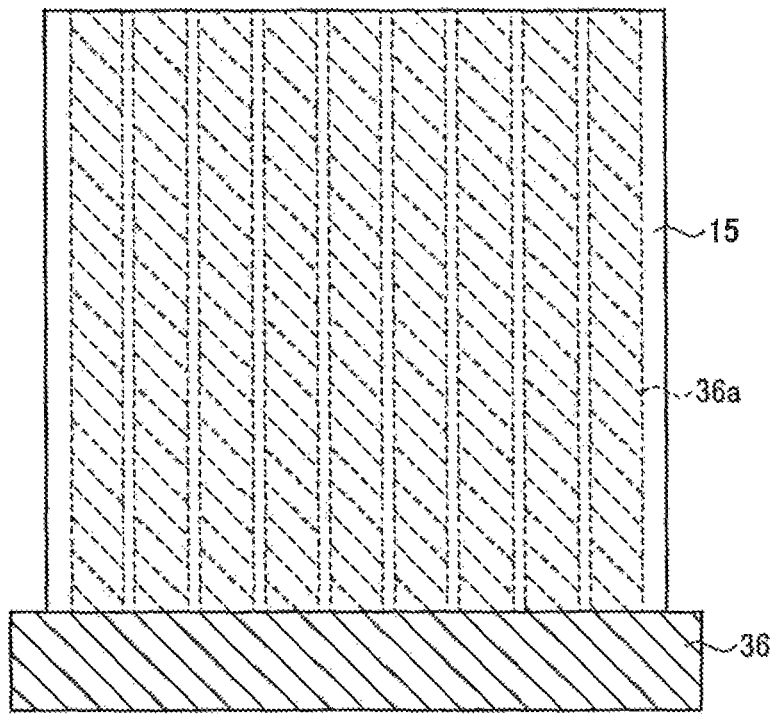
FIG. 10 is a second process view illustrating the method of forming the column-shaped cavities in the heat generation part.

FIG. 10 illustrates a state in which the viscoelastic body 15 fills the mold, and the column-shaped objects 36a is buried into it.

After having a heat treatment applied to the viscoelastic body 15 having the column-shaped objects 36a buried, the column-shaped objects 36a are pulled out of the viscoelastic body 15.

Figure 11:
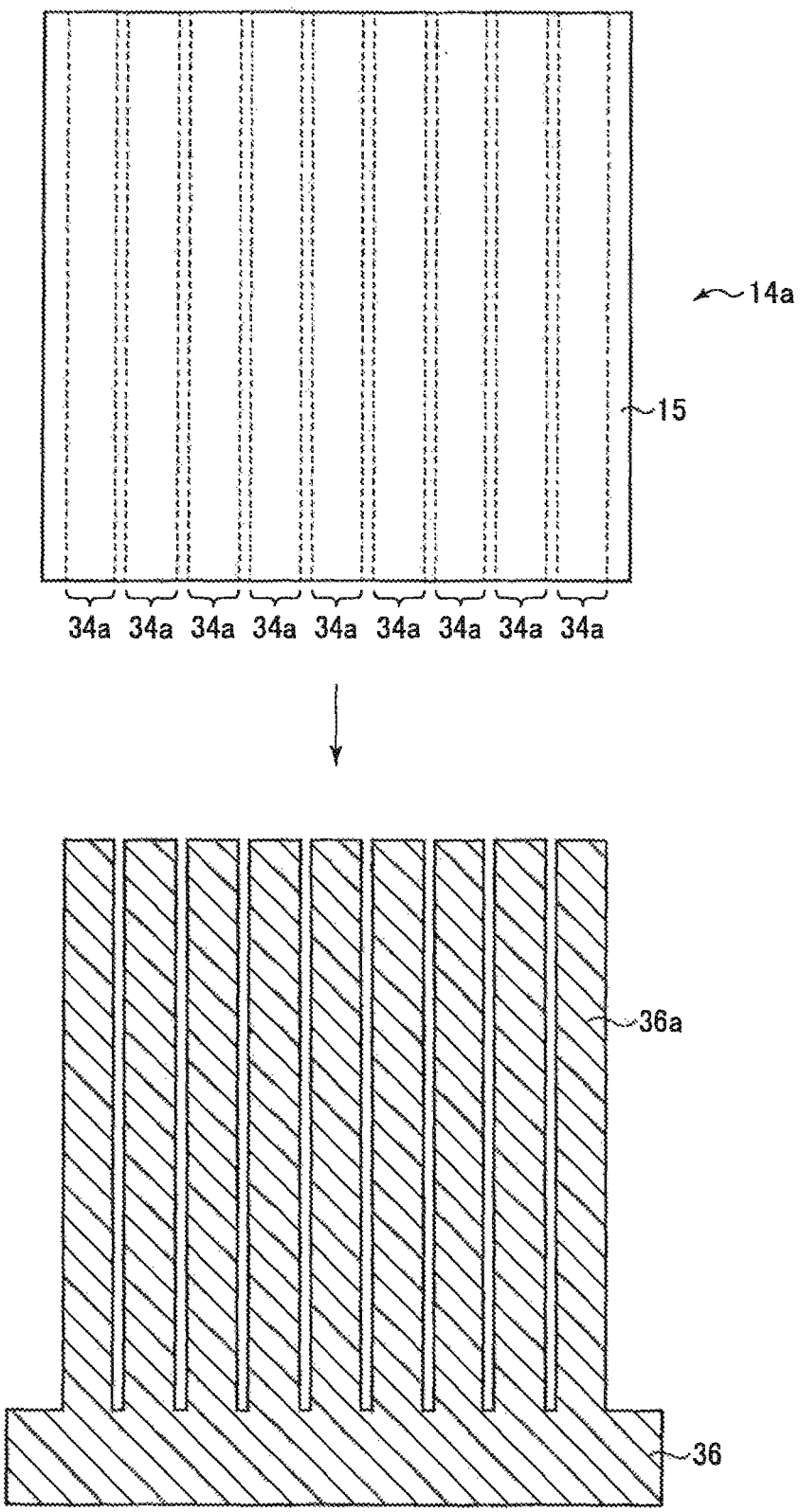
FIG. 11 is a third process view illustrating the method of forming the column-shaped cavities in the heat generation part.

FIG. 11 is a plan view illustrating a state where the column-shaped objects 36a have been pulled out.

In this way, the heat generation part 14a is obtained that is formed of the viscoelastic body 15 having the multiple column-shaped cavity 34a formed.

Thus, the shape of the cavity 34a may be a column-shape. When the shape of the cavity 34a is a column-shape, the heat generation part 14a is also easier to be deformed, a great stress locally concentrates on locations between the cavities 34a, with which a great heat quantity is obtained.

Second Embodiment

Figure 12:
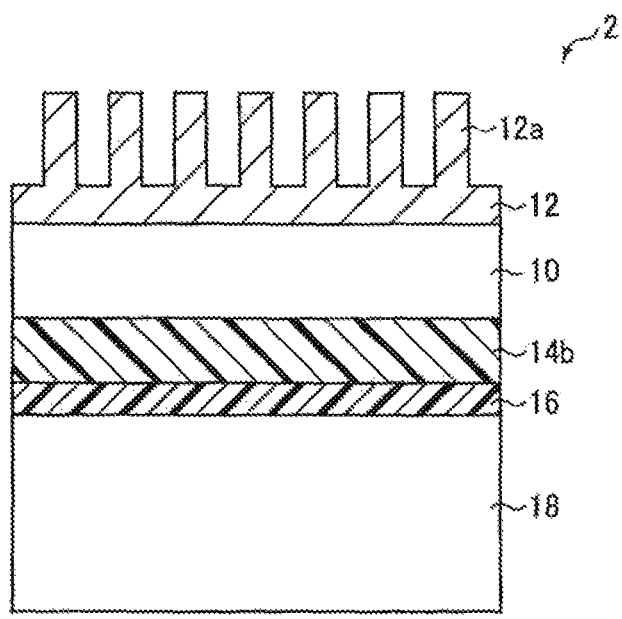
FIG. 12 is a cross-sectional view illustrating a power generation device according to a second embodiment of the present invention.
Figure 13A:
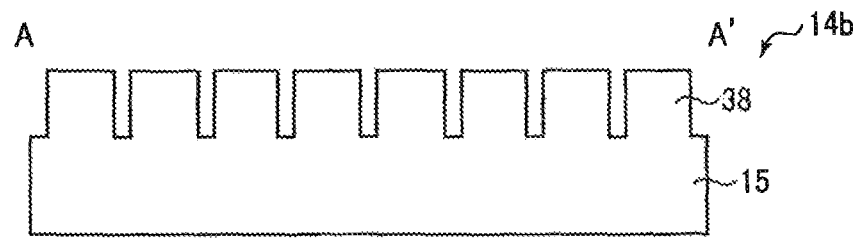
FIGS. 13A-13B are enlarged cross-sectional views illustrating a part of a heat generation body that is used in a power generation device according to the second embodiment.
Figure 13B:
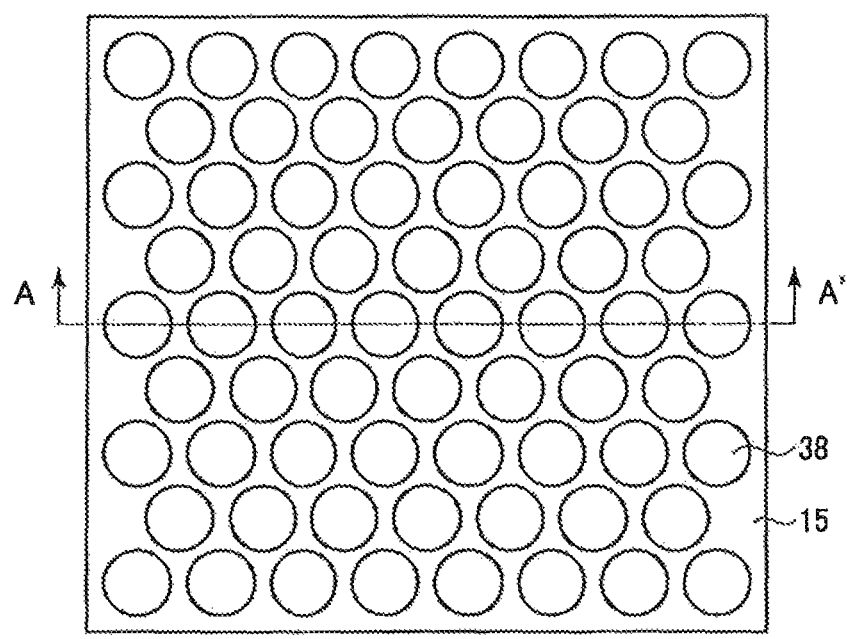

A power generation device will be described according to a second embodiment, using FIGS. 12-13B. FIG. 12 is a cross-sectional view illustrating a power generation device 2 according to the present embodiment. FIG. 13 is an enlarged cross-sectional view illustrating a part of a heat generation body that is used in the power generation device 2 according to tins present embodiment. The same elements as in the power generation device 2 in the first embodiment illustrated in FIGS. 1-11 are assigned the same numerical codes, and their description may be omitted or simplified.

According to the present embodiment, the power generation device 2 has a heat generation part. 14b formed of a viscoelastic body 15 that has multiple projecting part 38 formed.

As illustrated in FIG. 13, the viscoelastic body 15 has multiple projecting parts (projections, column-shaped objects, or column-shaped structures) 38 formed. The shape of the projecting part 38 is, for example, cylindrical. The height of the projecting part 38 is, for example, about 70 μm. The diameter of the projecting part 38 is, for example, about 10 μm. The density of the projecting parts 38 is, for example, about 50%.

Note that the shape of the projecting part 38 is not limited to a column shape, but may be a square-pillar shape.

The side of the viscoelastic body 15 having the projecting parts 38 formed contacts the thermoelectric conversion part 10. The side of the viscoelastic body 15 not having the projecting parts 38 formed contacts the highly-thermal-resistant member 16.

In the present embodiment, the viscoelastic body 15 has the multiple projecting parts 38 formed, and spaces exist beside the projecting parts 38. Since the spaces exist beside the projecting parts 38, each of the projecting parts 38 tends to be displaced depending on an external force. Therefore, when vibration is applied to the power generation device 2, a great stress locally concentrates on the projecting parts 38 to generate great deformation, with which a great heat quantity is obtained. Therefore, also in the present embodiment, a great temperature difference can be obtained between the one principal surface and the other principal surface of the thermoelectric conversion part 10, to generate a great amount of power.

Third Embodiment

Figure 14:
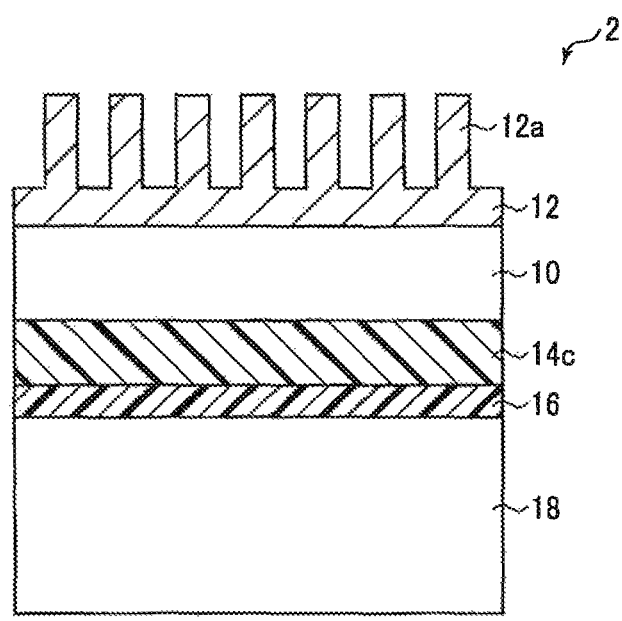
FIG. 14 is a cross-sectional view illustrating a power generation device according to a third embodiment of the present invention.
Figure 15:
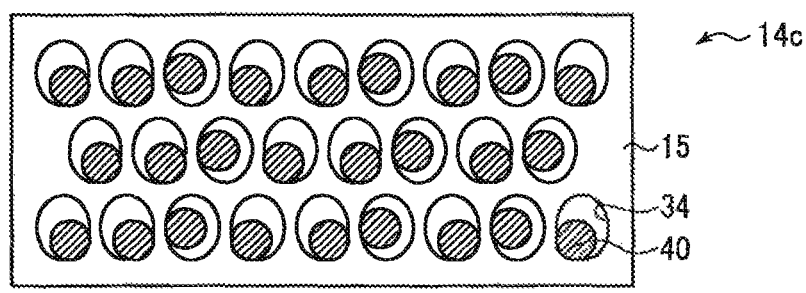
FIG. 15 is an enlarged cross-sectional view illustrating a part of a heat generation part that is used in a power generation device according to the third embodiment.

A power generation device will be described according to a third embodiment, using FIGS. 14-16B. FIG. 14 is a cross-sectional view illustrating a power generation device 2 according to the present embodiment. FIG. 15 is an enlarged cross-sectional view illustrating a part of a heat generation body that is used in the power generation device 2 according to the present embodiment. The same elements as in the power generation devices 2 in the first and second embodiments illustrated in FIGS. 1-13 are assigned the same numerical codes, and their description may be omitted or simplified.

According to the present embodiment, the power generation device 2 has weights 40 disposed in cavities 34.

As illustrated in FIG. 15, the viscoelastic body 15 has multiple cavities 34 formed. As the viscoelastic body 15, for example, a gelatinous silicone resin is used. The diameter of the cavity 34 is, for example, about 50 μm.

Each of the cavities 34 has a weight 40 in it. The weight 40 may be fixed on the inner surface of the cavity 34, or may be movable in the cavity 34. As a material of the weight 40, a material having a greater density than the viscoelastic body is used. In other words, the material of the weight 40 has the specific gravity greater than that of the viscoelastic body.

Here, as a material of the weight 40, for example, a metal ball is used. As the material of the metal ball, for example, Cu is used. The diameter of the weight 40 is, for example, about 30 µm.

In the present embodiment, the reason why the cavities 34 have the respective weights 40 is to generate local deformation in parts of the viscoelastic body 15 by inertial forces of the weights 40.

According to the present embodiment, it is possible to obtain a great heat quantity by deformation in the parts of the viscoelastic body 15 caused by vibration, together with deformation in the parts of the viscoelastic body 15 caused by the inertial forces of the weights 40.

Figure 16A:
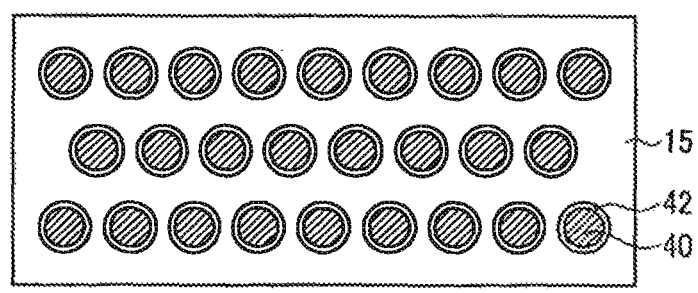
FIGS. 16A-16B are cross-sectional process views illustrating a method of disposing weights in cavities.
Figure 16B:
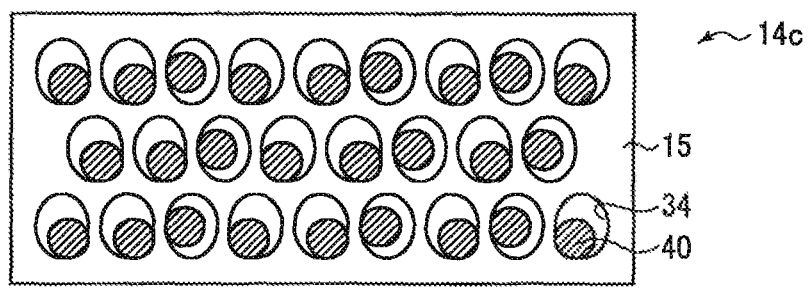

FIGS. 16A-16B are cross-sectional process views illustrating a method of disposing the weights 40 in the cavities 34.

For example, first, a gelatinous silicone resin (not illustrated) is poured into a mixer container (not illustrated) of a mixer (not illustrated).

Next, the gelatinous silicone resin is crushed to pieces by the mixer, to make it into a half-paste.

Next, multiple weights 40 having foaming agent layers 42 formed on their surfaces, respectively, are poured into the mixer container holding the half-pasted silicone resin, to be stirred by the mixer. The weights 40 having the foaming agent layers 42 formed on their surfaces, respectively, can be formed by having the weight 40 coated with a foaming agent. As a foaming agent, for example, sodium bicarbonate is used. In this way, multiple weights 40 having the foaming agent layers 42 formed on their surfaces, respectively, are uniformly mixed into the silicone resin.

Next, bubbles are removed from the silicone resin having the weights 40 mixed (defoaming). Note that the foaming agent 42 is not foamed at this stage.

Next, the silicone resin having defoaming applied is formed into a predetermined shape. In this way, the viscoelastic body 15 made of a gelatinous silicone resin layer is obtained that has the weights 40 mixed, and has been formed in the predetermined shape (see FIG. 16A).

Next, a heat treatment is applied to the viscoelastic body 15 having the multiple weights 40 mixed that have the foaming agent layers 42 formed (baking). The heat treatment temperature is, for example, about 150° C. The heat treatment time is, for example, about one hour. This makes the foaming agent in the foaming agent layers 42 foam, to form bubbles (cavities) 34. In this way, the process reaches a state where the weights 40 exist in the cavities 34 formed in the viscoelastic body 15.

Thus, according to the present embodiment, the cavities 34 have the respective weights 40 to generate local deformation in the parts of the viscoelastic body 15 by inertial forces of the weights 40. Therefore, according to the present embodiment, it is possible to obtain a greater heat quantity in a heat generation part 14c, by deformation in the parts of the viscoelastic body 15 caused by vibration, together with deformation in the parts of the viscoelastic body 15 caused by the inertial forces of the weights 40. Therefore, according to the present embodiment, it is possible to provide a power generation device having a greater power generation capacity.

Fourth Embodiment

Figure 17:
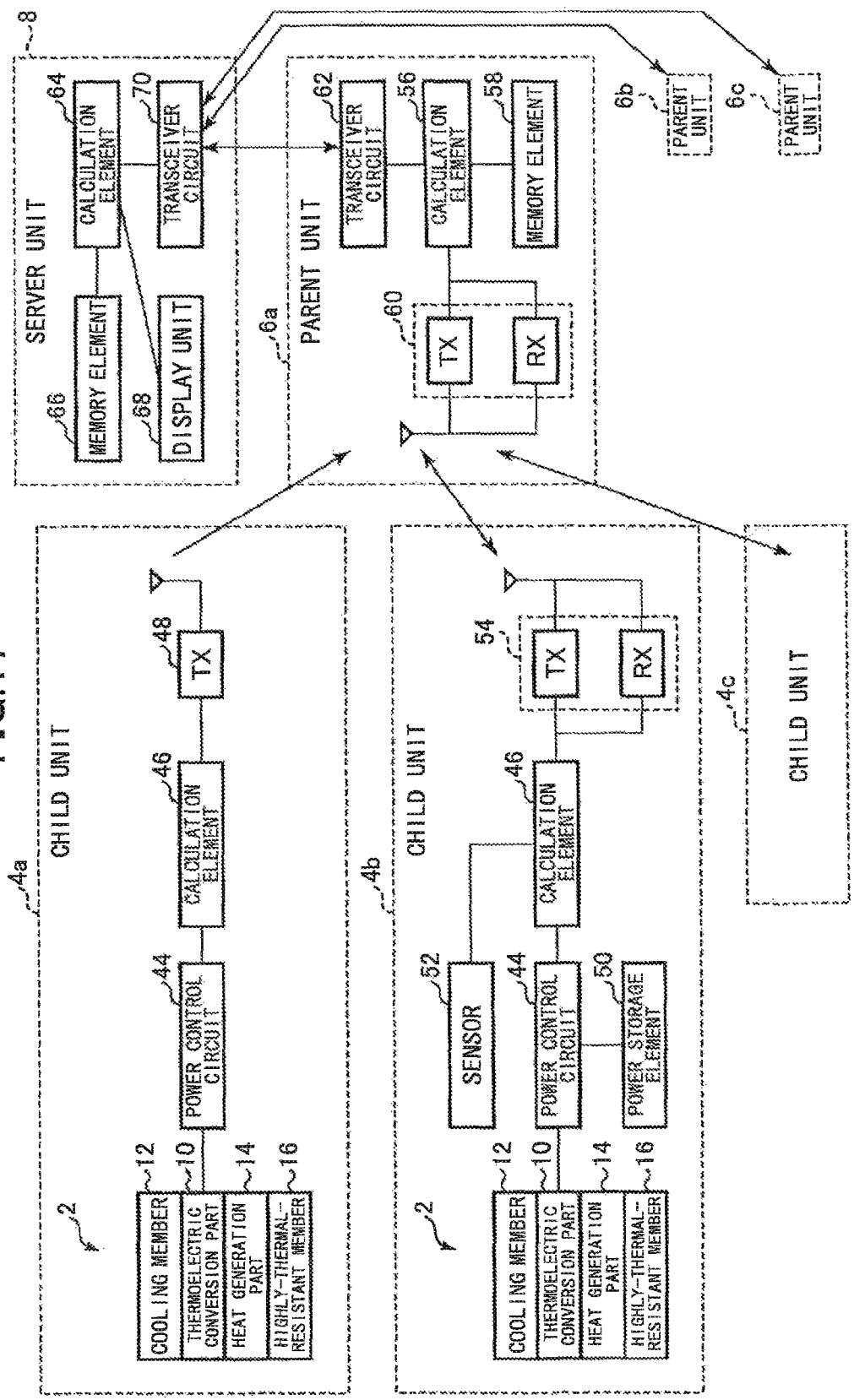
FIG. 17 is a block diagram illustrating a measurement system according to a fourth embodiment of the present invention.

A measurement device, and a measurement system that use the measurement devices will be described according to a fourth embodiment, using FIG. 17. FIG. 17 is a block diagram illustrating the measurement system according to the present embodiment. The same elements as in the power generation devices 2 in the first to third embodiments illustrated in FIGS. 1-16 are assigned the same numerical codes, and their description may be omitted or simplified.

According to the present embodiment, the measurement system includes multiple child units 4a-4c, multiple parent units 6a-6c, and a server unit 3 as illustrated in FIG. 17. According to the present embodiment, the measurement system has the server unit 8 execute predetermined information processing, by having the server unit 8 collect information about measurement results wirelessly transmitted from the multiple child units 4a-4c, namely, multiple measurement devices 4a-4c, via the parent units 6a-6c.

The child units 4a-4c, namely, the measurement devices 4a-4c are attached on oscillating bodies 18 (see FIG. 1) provided at respective locations. An oscillating body 18 may be, for example, a motor installed in a factory, an automobile, or the like.

The child unit (measurement device) 4a includes a power generation device 2 of one of the first to third embodiments, a power control circuit 44, a calculation element (MPU) 46, and a transmission circuit (transmission unit) (TX) 48.

Depending on vibration applied to the power generation device 2 of the child unit 4a, a voltage output from the thermoelectric conversion part 10 of the power generation device 2 may become greater. The power control circuit 44 becomes operational when the output voltage of the thermoelectric conversion part 10 becomes greater than or equal to a predetermined value. Namely, when the vibration transferred from the oscillating body 18 becomes greater than or equal to a predetermined value, the power control circuit 44 starts operating. The power control circuit 44 supplies power to the calculation element 46. The calculation element 46 is driven by the power supplied from the power control circuit 44. When the calculation element 46 operates, it means that vibration of the predetermined value or greater is being applied to the child unit 4a. The calculation element 46 can determine that vibration of the predetermined value or greater is being applied to the child unit 4a, based on the fact that the calculation element 46 has become operational. The calculation element 46 can transmit information that vibration of the predetermined value or greater is being applied to the child unit 4a, to the parent units 6a-6c, which will be described later, via the transmission circuit 48.

Also, the voltage value of the output of the thermoelectric conversion part 10 changes depending on the magnitude of the vibration applied to the power generation device 2 of the child unit 4a. Therefore, it is possible to convert the voltage value of the output of the thermoelectric conversion part 10 into a vibration value. The calculation element 46 may convert the voltage value of the output of the thermoelectric conversion part 10 into a vibration value, and may transmit information about the vibration value to the parent unit 6a-6c via the transmission circuit 48.

The child unit 4b includes a power generation device 2 of one of the first to third embodiments, a power control circuit 44, a power storage element 50, a sensor 52, a calculation element 46, and a transceiver circuit 54. TX represents a transmission circuit (transmission unit) in the transceiver circuit 54, and RX represents a receiver circuit (reception unit) in the transceiver circuit 54. The power control circuit 44 stores power generated by the thermoelectric conversion part 10, in the power storage element 50. As the power storage element 50, for example, a capacitor, a secondary battery, or the like can be used. Also, the power control circuit 44 supplies the power stored in the power storage element 50 to the calculation element 46. The calculation element 46 transmits measurement results such as measurement values obtained by the sensor 52 via the transmission circuit TX of the transceiver circuit 54. The sensor 52 may be, for example, a pressure sensor, a temperature sensor, a vibration sensor, or the like. Also, the calculation element 46 receives information transmitted from the parent units 6a-6c, via the receiver circuit RX in the transceiver circuit 54.

The child unit 4c may be the same as the child unit 4a, or may be the same as the child unit 4b. Also, the child unit 4c may have a configuration different from those of the child unit 4a and the child unit 4b.

Note that although three child units 4a-4c are illustrated here, the number of child units is not limited to three, but may be set appropriately.

The parent unit 6a includes a calculation element 56 (MPU), a memory element 58, a transceiver circuit 60, and a transceiver circuit 62. The calculation element 56 receives information transmitted from the child units 4a-4c via the receiver circuit RX in the transceiver circuit 60. Also, the calculation element 56 transmits information to the child units 4a-4c via the transmission circuit TX in the transceiver circuit 60. Also, the calculation element 56 receives and transmits information with the server unit (server apparatus) 8 via the transceiver circuit 62. The single parent unit 6a collects information obtained by the multiple child units 4a-4c.

The parent units 6b-6c may have the same configuration as the parent unit 6a, or may have configurations different from that of the parent unit 6a. Each of the parent units 6b-6c collects information obtained by multiple child units, respectively.

The server unit 8 (processor) includes a calculation element (MPU) 64, a memory element 66, a display unit 68, and a transceiver circuit 70. The calculation element 64 receives and transmits information with the multiple parent units 6a-6c via the transceiver circuit 70. The calculation element 64 collects information about measurement results obtained by the child units 4a-4c, namely, the measurement devices 4a-4c in the present embodiment, via the parent units 6a-6c, and executes predetermined information processing. The calculation element 64 stores results of the information processing in the memory element 66. As the memory element 66, for example, an HDD (Hard Disc Drive), a RAM (Random Access Memory), or the like may be used. As the display unit 68, for example, an LCD display device or the like may be used.

In this way, the measurement system is configured according to the present embodiment.

According to the present embodiment, the measurement devices 4a-4c can be driven without supplying power from the outside because the power generation devices 2, which generate power by vibration transferred from the oscillating bodies 18, are provided in the respective measurement devices 4a-4c. The measurement devices 4a-4c can be attached in locations where power can be hardly supplied from the outside, and hence, can obtain measurement results in various locations.

Modified Embodiments

Embodiments of the present invention are not limited to those described above, but various modified embodiments are possible.

For example, in the above embodiments, an example is described where a silicone resin is used for the viscoelastic body 15 used in the heat generation part 14, but the viscoelastic body is not limited to the silicone resin. Various viscoelastic bodies 15 can be used for the heat generation part 14. For example, as a viscoelastic body 15 used for the heat generation part 14, acrylic rubber, silicone rubber, or the like may be used.

Also, in the above embodiments, an example is described where sodium bicarbonate is used as a foaming agent, but the foaming agent is not limited to sodium bicarbonate. For example, as a foaming agent, an organic foaming agent may be used. As an organic foaming agent, for example, azodicarbonamide (ADCA), dinitrosopentamethylenetetramine (DPT), p,p'-oxybisbenzenesulfonylhydrazide (OBSH), or the like may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power generation device, comprising:
a thermoelectric conversion part;
a cooling member configured to be disposed on one principal surface of the thermoelectric conversion part;
a heat generation part configured to be disposed on another principal surface of the thermoelectric conversion part, to be formed of a viscoelastic body having a plurality of cavities formed in the viscoelastic body, and to generate heat by vibration; and
a thermal resistance layer configured to have a thermal resistance value greater than a sum of a thermal resistance value of the cooling member and a thermal resistance value of the thermoelectric conversion part, and to have the heat generation part positioned between the thermoelectric conversion part and the thermal resistance layer.

2. A power generation device, comprising:
a thermoelectric conversion part;
a cooling member configured to be disposed on one principal surface of the thermoelectric conversion part;
a heat generation part configured to be disposed on another principal surface of the thermoelectric conversion part, to be formed of a viscoelastic body having a plurality of projecting parts formed, and to generate heat by vibration; and
a thermal resistance layer configured to have a thermal resistance value greater than a sum of a thermal resistance value of the cooling member and a thermal resistance value of the thermoelectric conversion part, and to have the heat generation part positioned between the thermoelectric conversion part and the thermal resistance layer.

3. The power generation device, as claimed in claim 1, wherein in each of the cavities, a weight having dimensions smaller than dimensions of the cavity exists.

4. The power generation device, as claimed in claim 1, wherein an equivalent spring constant of the thermal resistance layer is greater than an equivalent spring constant of the heat generation part.

5. The power generation device, as claimed in claim 1, wherein the thermal resistance layer and the heat generation part are formed as a whole.

6. The power generation device, as claimed in claim 1, wherein each of the cavities is formed in a spherical shape, an ellipsoidal shape, or a cylindrical shape.

7. A measurement device, comprising:
a power generation device; and
a transmission unit configured to be driven by the power generation device, and to transmit a measurement result,
wherein the power generation device is configured to include
a thermoelectric conversion part,
a cooling member configured to be disposed on one principal surface of the thermoelectric conversion part, and
a heat generation part configured to be disposed on another principal surface of the thermoelectric conversion part, to be formed of a viscoelastic body having a plurality of cavities formed in the viscoelastic body, or to be formed of a viscoelastic body having a plurality of projecting parts formed, and to generate heat by vibration; and
a thermal resistance layer configured to have a thermal resistance value greater than a sum of a thermal resistance value of the cooling member and a thermal resistance value of the thermoelectric conversion part, and to have the heat generation part positioned between the thermoelectric conversion part and the thermal resistance layer.

8. A measurement system, comprising:
a plurality of measurement devices; and
a processor configured to process measurement results transmitted from the respective measurement devices,
wherein each of the measurement devices is configured to include
a power generation device; and
a transmission unit configured to be driven by the power generation device, and to transmit a measurement result,
wherein the power generation device is configured to include
a thermoelectric conversion part,
a cooling member configured to be disposed on one principal surface of the thermoelectric conversion part, and
a heat generation part configured to be disposed on another principal surface of the thermoelectric conversion part, to be formed of a viscoelastic body having a plurality of cavities formed in the viscoelastic body, or to be formed of a viscoelastic body having a plurality of projecting parts formed, and to generate heat by vibration; and
a thermal resistance layer configured to have a thermal resistance value greater than a sum of a thermal resistance value of the cooling member and a thermal resistance value of the thermoelectric conversion part, and to have the heat generation part positioned between the thermoelectric conversion part and the thermal resistance layer.

* * * * *